United States Patent
Fletcher et al.

(10) Patent No.: US 10,468,247 B2
(45) Date of Patent: Nov. 5, 2019

(54) FLUID DROPLET METHODOLOGY AND APPARATUS FOR IMPRINT LITHOGRAPHY

(71) Applicant: CANON KABUSHIKI KAISHA, Tokyo (JP)

(72) Inventors: Edward Brian Fletcher, Austin, TX (US); Zhengmao Ye, Austin, TX (US)

(73) Assignee: CANON KABUSHIKI KAISHA, Tokyo (JP)

(*) Notice: Subject to any disclaimer, the term of this patent is extended or adjusted under 35 U.S.C. 154(b) by 58 days.

(21) Appl. No.: 15/375,848

(22) Filed: Dec. 12, 2016

(65) Prior Publication Data
US 2018/0166349 A1    Jun. 14, 2018

(51) Int. Cl.
*H01L 21/027* (2006.01)
*G03F 7/00* (2006.01)

(52) U.S. Cl.
CPC .......... *H01L 21/027* (2013.01); *G03F 7/0002* (2013.01)

(58) Field of Classification Search
CPC ....... H01L 21/027–0338; B05C 5/0291; G03F 7/0002
See application file for complete search history.

(56) References Cited

U.S. PATENT DOCUMENTS

| | | | | |
|---|---|---|---|---|
| 4,216,480 A * | 8/1980 | Buehner | ................ | B41J 2/5056 347/14 |
| 5,788,385 A * | 8/1998 | Inoue | ..................... | B41J 2/5056 347/37 |
| 6,164,745 A * | 12/2000 | Nagoshi | ................. | B41J 19/142 347/15 |
| 6,280,023 B1 * | 8/2001 | Ufkes | ...................... | B41J 2/085 347/78 |
| 6,527,379 B1 * | 3/2003 | Martin | ....................... | B41J 2/02 347/73 |
| 8,119,052 B2 | 2/2012 | Schumaker | | |
| 8,512,797 B2 | 8/2013 | Schumaker | | |
| 8,586,126 B2 | 11/2013 | Schumaker | | |
| 9,028,022 B2 | 5/2015 | Kodama et al. | | |
| 2002/0113849 A1 * | 8/2002 | Hawkins | .................... | B41J 2/03 347/77 |
| 2004/0228964 A1 * | 11/2004 | Ito | ....................... | H01L 51/0005 427/64 |

(Continued)

FOREIGN PATENT DOCUMENTS

WO    2013129679 A1    9/2013

*Primary Examiner* — Amar Movva
(74) *Attorney, Agent, or Firm* — Abel Schillinger, LLP

(57) ABSTRACT

A method can be used to generate a fluid droplet pattern for an imprint lithography process using a fluid dispense system having fluid dispense ports. The method can include determining a first fluid droplet pattern for the formable material dispensed at a preset minimum pitch or an integer multiple thereof; determining a second fluid droplet pattern based on the first fluid droplet pattern, wherein the second fluid droplet pattern is a non-integer multiple of the preset minimum pitch; determining an adjusted speed of the substrate and the fluid dispense ports relative to each other to generate the second fluid droplet pattern; moving the substrate and the fluid dispense ports relative to each other at the adjusted speed; and dispensing the formable material through the fluid dispense ports at the preset frequency to form the second fluid droplet pattern on the substrate.

16 Claims, 3 Drawing Sheets

(56) References Cited

U.S. PATENT DOCUMENTS

| | | | |
|---|---|---|---|
| 2006/0051498 A1* | 3/2006 | Katagami | B41J 2/2114 427/66 |
| 2007/0035597 A1* | 2/2007 | Ready | B41J 2/2139 347/99 |
| 2007/0237886 A1* | 10/2007 | Dijksman | B41J 3/4071 427/8 |
| 2007/0278712 A1* | 12/2007 | Okushima | B82Y 10/00 264/236 |
| 2008/0018875 A1* | 1/2008 | Schram | B82Y 10/00 355/67 |
| 2009/0185018 A9* | 7/2009 | Ready | B41J 2/2139 347/99 |
| 2009/0267268 A1* | 10/2009 | Yoneda | B82Y 10/00 264/319 |
| 2010/0099322 A1* | 4/2010 | Katagami | B41J 3/28 445/24 |
| 2012/0050441 A1* | 3/2012 | Mikami | B82Y 10/00 347/110 |
| 2013/0010020 A1* | 1/2013 | Kodama | B82Y 10/00 347/10 |
| 2013/0020281 A1* | 1/2013 | Wakamatsu | B41J 2/2135 216/40 |
| 2013/0120485 A1* | 5/2013 | Kodama | B41J 2/04508 347/14 |
| 2014/0368568 A1* | 12/2014 | Kodama | B41J 25/003 347/9 |
| 2015/0014876 A1 | 1/2015 | Yamashita et al. | |
| 2015/0014877 A1 | 1/2015 | Yamashita et al. | |
| 2015/0017329 A1 | 1/2015 | Fletcher et al. | |

* cited by examiner

FLUID DROPLET METHODOLOGY AND APPARATUS FOR IMPRINT LITHOGRAPHY

FIELD OF THE DISCLOSURE

The present disclosure relates to imprint lithography, and more particularly to fluid droplet patterning for imprint lithography applications.

RELATED ART

Imprint lithography apparatuses and processes are useful in forming nanoscale patterns on semiconductor wafers in the fabrication of electronic devices. Such apparatuses and processes can include the use of fluid dispense systems for depositing a formable material, for example, a polymerizable material, such as a resin or a resist, onto the wafer, using techniques such as fluid droplet dispense. The dispensed material is contacted with an imprint template (or mold) having desired pattern features and then solidified, forming a patterned layer on the wafer. Template feature fill rates and related defects are dependent, in part, on template pattern feature density and orientation and the droplet pattern arrangement, including inter-droplet spacing.

Traditional fluid dispense systems permit some adjustment of inter-droplet spacing, however, they typically have constraints that limit the extent of such adjustments. Thus, there continues to be an industry demand for droplet pattern processes which are more finely adjustable and which are not limited by dispenser limitations.

SUMMARY OF THE INVENTION

In an aspect, a method can be used to generate a fluid droplet pattern for an imprint lithography process. The method comprises:
providing a fluid dispense system having fluid dispense ports defining a line, the fluid dispense system further configured to dispense fluid droplets of a formable material at a preset frequency to achieve spaced-apart droplets on a substrate at a preset minimum pitch as the substrate and the fluid dispense ports move relative to each other at a preset speed along in a translating direction that is generally transverse to the line;
determining a first fluid droplet pattern for dispensing the formable material onto the substrate, the first fluid droplet pattern based in part on a pattern of an imprint lithography template, and wherein the first fluid droplet pattern is representative of fluid droplets spaced apart on the substrate at the preset minimum pitch or an integer multiple thereof as the substrate and the fluid dispense ports are moved relative to each other at the preset speed along the transverse direction;
determining a second fluid droplet pattern based on the first fluid droplet pattern, wherein the second fluid droplet pattern is representative of fluid droplets spaced apart at a non-integer multiple of the preset minimum pitch;
determining an adjusted speed of the substrate and the fluid dispense ports relative to each other to generate the second fluid droplet pattern, wherein the adjusted speed is different than the preset speed the substrate and the fluid dispense ports relative to each other;
moving the substrate and the fluid dispense ports relative to each other at the adjusted speed in the translating direction; and
dispensing the formable material through the fluid dispense ports at the preset frequency to form the second fluid droplet pattern on the substrate.

In an embodiment, the method further comprises forming a patterned layer on the substrate with the imprint lithography template and the second fluid droplet pattern, wherein the patterned layer has less non-fill defects than another patterned layer formed on the substrate using the imprint lithography template and the first fluid droplet pattern.

In another embodiment, the method further comprises forming a patterned layer on the substrate with the imprint lithography template, wherein the patterned layer has a residual layer thickness (RLT) different than an RLT of another patterned layer formed on the substrate using the imprint lithography template and the first fluid droplet pattern.

In a particular embodiment, when expressed as a percentage, a variation of the RLT of the patterned layer is less than a variation of the RLT of the other layer.

In a further embodiment, the second fluid droplet pattern has a first pitch in the translating direction and a second pitch along the line.

In still another embodiment, dispensing the formable material is performed such that droplets in the second fluid droplet pattern are formed in at least one less pass as compared to dispensing the formable material through the fluid dispense ports at the preset frequency and preset minimum pitch.

In yet another embodiment, the second fluid droplet pattern includes a first set of fluid droplets having a first fluid droplet pitch and a second set of fluid droplets having a second droplet pitch different from the first fluid droplet pitch, wherein the first fluid droplet pitch or the second fluid droplet pitch is a non-integer multiple of the minimum preset pitch.

In a particular embodiment, the method further comprises changing the adjusted speed from a first speed to a second speed after dispensing the first set of fluid droplets and before dispensing the second set of fluid droplets.

In another particular embodiment, the adjusted speed includes a first speed; and moving the substrate and the fluid dispense ports relative to each other and dispensing the formable material comprises moving the substrate and the fluid dispense ports relative to each other at the first speed and dispensing the formable material through the fluid dispense ports at the preset frequency to form the first set of fluid droplets on the substrate.

In a more particular embodiment, the adjusted speed further includes a second speed; and moving the substrate and the fluid dispense ports relative to each other and dispensing the formable material comprises moving the substrate and the fluid dispense ports relative to each other at a second speed and dispensing the formable material through the fluid dispense ports at the preset frequency to form the second set of fluid droplets on the substrate.

In an embodiment, the adjusted speed is less than the preset speed.

In a further embodiment, the adjusted speed is greater than the preset speed.

In still another embodiment, each of the first and second fluid droplet patterns is in a rectangular, grid shape.

In yet another embodiment, each of the first and second fluid droplet patterns is in a diamond shape.

In another aspect, a method can be used to manufacture an article, the method comprising:
providing a fluid dispense system having fluid dispense ports defining a line, the fluid dispense system further configured to dispense fluid droplets of a formable material at a preset frequency to achieve spaced-apart droplets on a substrate at a preset minimum pitch as the substrate and the fluid dispense ports move relative to each other at a preset speed along in a translating direction that is generally transverse to the line;

determining a first fluid droplet pattern for dispensing the formable material onto the substrate, the first fluid droplet pattern based in part on a pattern of an imprint lithography template, and wherein the first fluid droplet pattern is representative of fluid droplets spaced apart on the substrate at the preset minimum pitch or an integer multiple thereof as the substrate and the fluid dispense ports are moved relative to each other at the preset speed along the transverse direction;

determining a second fluid droplet pattern based on the first fluid droplet pattern, wherein the second fluid droplet pattern is representative of fluid droplets spaced apart at a non-integer multiple of the preset minimum pitch;

determining an adjusted speed of the substrate and the fluid dispense ports relative to each other to generate the second fluid droplet pattern, wherein the adjusted speed is different than the preset speed the substrate and the fluid dispense ports relative to each other;

moving the substrate and the fluid dispense ports relative to each other at the adjusted speed in the translating direction; and dispensing the formable material through the fluid dispense ports at the preset frequency to form the second fluid droplet pattern on the substrate;

contacting the formable material with the template having a patterned surface; and curing the formable material to form a patterned layer corresponding to the pattern surface of the template.

In an embodiment, the article includes an electronic device, and the substrate includes a semiconductor wafer.

In a further aspect, an apparatus for imprint lithography comprises:

a fluid dispense system having fluid dispense ports defining a line, the fluid dispense system further configured to dispense fluid droplets of a formable material at a preset frequency to achieve spaced-apart droplets on a substrate at a preset minimum pitch as the substrate is moved relative to the fluid dispense ports at a preset speed along a translating direction that is generally transverse to the line;

a stage adapted to move a substrate relative to the fluid dispense ports in the transverse direction; and a logic element configured to:

determine a first fluid droplet pattern for dispensing the formable material onto the substrate, the first fluid droplet pattern based in part on a pattern of an imprint lithography template, and wherein the first fluid droplet pattern is representative of fluid droplets spaced apart on the substrate at the preset minimum pitch or an integer multiple thereof as the substrate and the fluid dispense ports are moved relative to each other at the preset speed along the transverse direction;

determine a second fluid droplet pattern based on the first fluid droplet pattern, wherein the second fluid droplet pattern is representative of fluid droplets spaced apart at a non-integer multiple of the preset minimum pitch;

determine an adjusted speed of the substrate and the fluid dispense ports relative to each other to generate the second fluid droplet pattern, wherein the adjusted speed is different than the preset speed the substrate and the fluid dispense ports relative to each other;

transmit information to move the substrate and the fluid dispense ports relative to each other at the adjusted speed in the translating direction; and transmit information to dispense the formable material through the fluid dispense ports at the preset frequency to form the second fluid droplet pattern on the substrate.

In an embodiment, an arrangement of the fluid dispense ports determine a Y-direction pitch.

In a particular embodiment, a combination of a preset frequency and the adjusted speed determine an X-direction pitch.

In another embodiment, the logic element is further configured to transmit information to change from the adjusted speed to a different speed after dispensing a first set of droplets of the second fluid droplet pattern and before dispensing a second set of fluid of the second fluid droplet pattern, wherein the first and second sets of fluid droplets are dispensed in a same pass in the translating direction.

BRIEF DESCRIPTION OF THE DRAWINGS

Embodiments are illustrated by way of example and are not limited in the accompanying figures.

Figure 1:
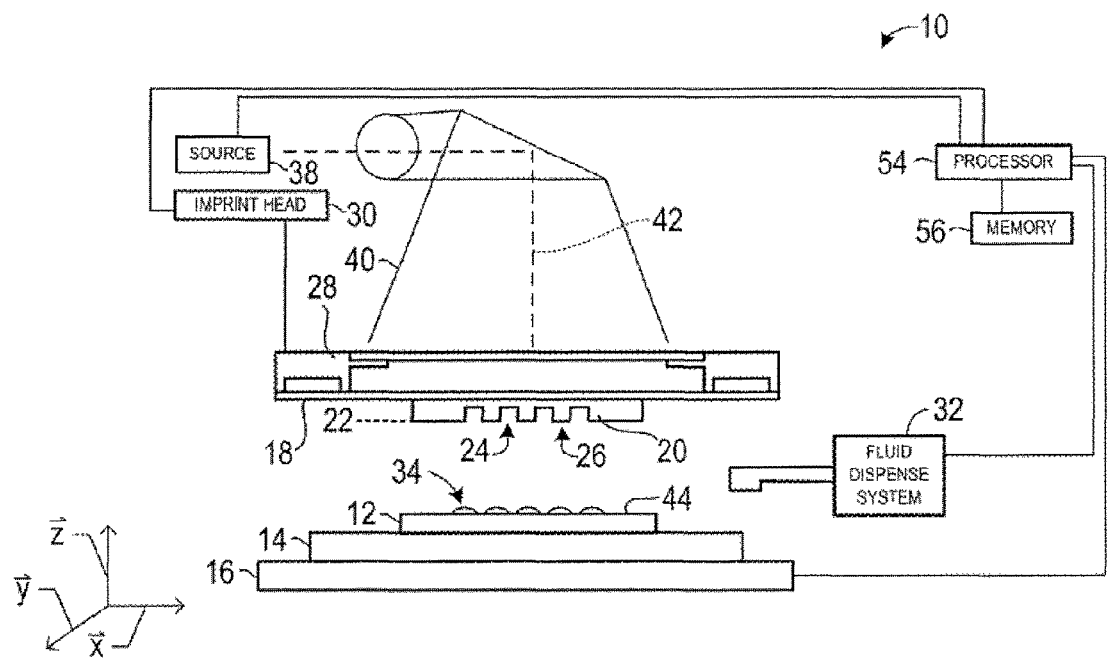
FIG. 1 includes a simplified side view of an exemplary imprint lithography system.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

The term "pitch" is intended to mean a distance from a center of a feature to a center of a next adjacent feature. For a fluid droplet pattern, the pitch is a distance from the center of a droplet to the center of the next adjacent droplet. In Cartesian coordinates, a two-dimensional pattern (a pattern as seen from a top or plan view) can have a pitch in the X-direction that corresponds to the distance between the centers of the features as measured in the X-direction (X-direction pitch), and a pitch in the Y-direction that corresponds to the distance between the centers of the features as measured in the Y-direction (Y-direction pitch). The X-direction pitch may be the same or different from the Y-direction pitch.

As used herein, speed and motion may be described on a relative basis. For example, object A and object B move relative to each other. Such terminology is intended to cover object A is moving, and object B is not; object A is not moving, and object B is moving; and both of objects A and B are moving.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint and lithography arts.

In accordance with one or more embodiments described herein, an apparatus can be used to generate a fluid droplet pattern for an imprint lithography process. The apparatus can include a fluid dispense system, a stage, and a logic element. The fluid dispense system can have fluid dispense ports defining a line, the fluid dispense system further configured to dispense fluid droplets of a formable material at a preset frequency to achieve spaced-apart droplets on a substrate at a preset minimum pitch as the substrate and the fluid dispense ports move relative to each other at a preset speed along in a translating direction that is generally transverse to the line. In a particular embodiment, the translating direction can be absolutely transverse to the line. The stage can be adapted to move a substrate relative to the fluid dispense ports in the transverse direction. The logic element may perform or assist in the performance of one or more of the activities described with respect to any one or more of the methods described herein.

In an embodiment, a method of generating a fluid droplet pattern for an imprint lithography process can include determining a first fluid droplet pattern for dispensing the formable material onto the substrate, the first fluid droplet pattern based in part on a pattern of an imprint lithography template, and wherein the first fluid droplet pattern is representative of fluid droplets spaced apart on the substrate at the preset minimum pitch or an integer multiple thereof as the substrate and the fluid dispense ports are moved relative to each other at the preset speed along the transverse direction. The method can further include determining a second fluid droplet pattern based on the first fluid droplet pattern, wherein the second fluid droplet pattern is representative of fluid droplets spaced apart at a non-integer multiple of the preset minimum pitch. The method can still further include determining an adjusted speed of the substrate and the fluid dispense ports relative to each other to generate the second fluid droplet pattern, wherein the adjusted speed is different than the preset speed the substrate and the fluid dispense ports relative to each other. The method can also include moving the substrate and the fluid dispense ports relative to each other at the adjusted speed in the translating direction; and dispensing the formable material through the fluid dispense ports at the preset frequency to form the second fluid droplet pattern on the substrate.

In an embodiment, the method of generating the fluid droplet pattern can be used in manufacturing an article. After forming the fluid droplet pattern over the substrate, the method can further include contacting the formable material with the template having a patterned surface; and curing the formable material to form a patterned layer corresponding to the pattern surface of the template. In a particular embodiment, the article includes an electronic device, and the substrate includes a semiconductor wafer.

Details regarding the apparatus and method are better understood after reading this specification in conjunction with figures. The description below is meant to illustrate embodiments and not limit the scope of the present invention, which is defined in the appended claims.

Referring to the figures, and particularly to FIG. 1, a lithographic system 10 in accordance with embodiments described herein can be used to form a relief pattern on a substrate 12. The substrate 12 may be coupled to a substrate chuck 14. As illustrated, substrate chuck 14 is a vacuum chuck; however, in other embodiments the substrate chuck 14 may be any chuck including vacuum, pin-type, groove-type, electrostatic, electromagnetic, or the like. Exemplary chucks are described in U.S. Pat. No. 6,873,087, which is hereby incorporated by reference in its entirety herein.

Substrate 12 and substrate chuck 14 may be further supported by a stage 16. The stage 16 may provide translational or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mesa 20 extending therefrom towards the substrate 12. The mesa 20 is sometimes referred to as a mold 20. In an embodiment, the template 18 can be formed without a mesa 20.

The template 18 or mold 20 may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, a patterning surface 22 includes features defined by spaced-apart recesses 24 and protrusions 26. The disclosure is not intended to be limited to such configurations (e.g., planar surfaces). Patterning surface 22 may define any original pattern that forms the basis of a pattern to be formed on the substrate 12. In another embodiment, the patterning surface 22 can be a blank, that is, not have any recesses or projections.

The template 18 can be coupled to a chuck 28. The chuck 28 can be configured as vacuum, pin-type, groove-type, electrostatic, electromagnetic, or another similar chuck type. Exemplary chucks are further described in U.S. Pat. No. 6,873,087. In an embodiment, the chuck 28 may be coupled to an imprint head 30 such that the chuck 28 or imprint head 30 can facilitate movement of the template 18.

The lithographic system 100 can further include a fluid dispense system 32 used to deposit a formable material 34 on the substrate 12. For example, the formable material can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is defined between the mold 22 and the substrate 12 depending on design considerations. For example, the formable material 34 can include a monomer mixture as described in U.S. Pat. Nos. 7,157,036 and 8,076,386, both of which are herein incorporated by reference in their entireties.

Figure 2:
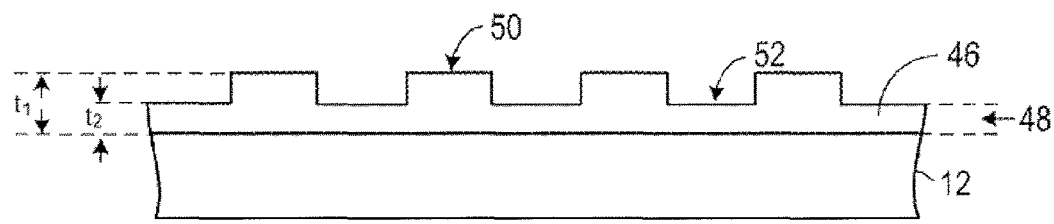
FIG. 2 includes a simplified side view of the substrate illustrated in FIG. 1, having a patterned layer.

Referring to FIGS. 1 and 2, the lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56.

In an embodiment, either the imprint head 30, the stage 16, or both the imprint head 30 and the stage 16 vary a distance between the mold 20 and the substrate 12 to define a desired volume therebetween that is filled by the formable material 34. For example, the imprint head 30 can apply a force to the template 19 such that the mold 20 contacts the formable material 34 on the substrate 12. After the desired volume is filled with the formable material 34, the source 38 can produce energy 40, e.g., ultraviolet radiation, causing the formable material 34 to solidify or cross-link conforming to a shape of the surface 44 of the substrate 12 and patterning surface 22 defining a patterned layer 46 on the substrate 12. The patterned layer 46 can include features illustrated as protrusions 50 and recessions 52, with the protrusions 50 having a thickness, $t_1$ and the recessions 52 correspond to a residual layer having a thickness $t_2$, which is the residual layer thickness (RLT).

High throughput at low defect density is an important consideration in imprint lithography processes. When employing a droplet dispense method of applying the formable material to the substrate, the imprint process cycle generally includes (1) dispensing (or depositing) fluid droplets of formable material on a substrate surface, (2) bringing a template into contact with the fluid droplets such that the fluid spreads and fills the topography of the template patterning surface, (3) solidifying (e.g., photocuring) the fluid, and (4) separating the template from the substrate, leaving a solidified layer of formable material having a relief image of the template pattern on the substrate surface. Dispensing fluid droplets of formable material on the substrate surface and proper filling of the pattern of the template 18 are major contributors to the imprint cycle time, and thus throughput. Particular template patterns may require multiple passes of the substrate 12 relative to the imprint head 30. That is, the substrate 12 and imprint head 30 must be translated relative to each other multiple times. Multiple dispensing passes are common, for example, when templates have dense feature patterns or for particular patterns requiring adjacent droplets be positioned closer together. Methods and systems to reduce dispense time are described in accordance with one or more embodiments described herein.

During dispensing, fluid droplets of formable material are dispensed from the fluid dispense system 32 to create a pattern of fluid droplets on the substrate surface. The fluid droplet pattern can be determined such that the total volume of the fluid droplets on the surface matches the total volume for the desired fluid droplet pattern. As well as matching the total volume of the desired fluid droplet pattern, it may be desirable to match the local volume of the desired fluid droplet pattern. Thus, a greater volume of fluid can be dispensed in a region of the substrate where a greater volume of formable material is desired.

Available inkjet systems can be tuned to dispense formable material fluid droplets with volumes in the range of 0.1 to 10 picoliters (pL) or greater, with 0.9 pL being an exemplary fluid droplet volume. The fluid droplets can be dispensed in patterns formed by one or more passes of the imprint head 30 and substrate 12 relative to one another. An exemplary pattern includes a rectangular, grid pattern, a diamond pattern, another suitable pattern, or any combination thereof.

Figure 3:
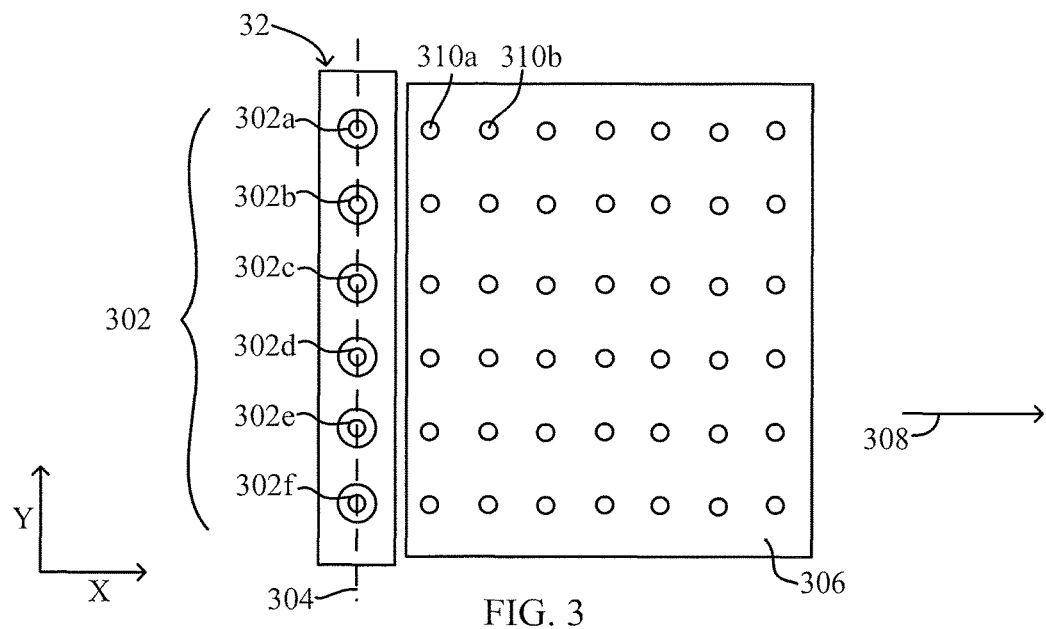
FIG. 3 includes a simplified top view of a fluid dispense system including fluid dispense ports and an exemplary droplet pattern deposited upon a substrate surface.

Referring to FIG. 3, the fluid dispense system 32 can include fluid dispense ports 302. As illustrated, the fluid dispense system 32 includes six fluid dispense ports 302a, 302b, 302c, 302d, 302e, and 302f; however, the number of fluid dispense ports 302 can be less than or greater than six, such as for example, at least two fluid dispense ports, at least three fluid dispense ports, at least four fluid dispense ports, at least five fluid dispense ports, at least ten fluid dispense ports, or at least twenty fluid dispense ports. In an embodiment, the fluid dispense ports 302 can include a set of at least three fluid dispense ports (e.g., fluid dispense ports 302a, 302b, and 302c) lying along a straight line 304. The fluid dispense system 32 and a surface 306 located there below (e.g., on the substrate 12 or the substrate chuck 14) can be moveable in a direction (illustrated by arrow 308) generally transverse to the line 304. Such direction is referred as this transverse direction. As used herein, "generally transverse" refers to a relative angular position between two objects of 90°±10°. In an embodiment, the fluid dispense system 32 and surface 306 can be moveable in a direction absolutely transverse to the line 304. As used herein, "absolutely transverse" refers to a relative angular position between two objects of 90°.

In traditional dispensing operations of formable material, a Y-direction pitch is fixed by a distance between centers of adjacent fluid dispense ports, and therefore, the Y-direction pitch is determined by the physical layout of the fluid dispense ports in the fluid dispense head.

A fluid dispense head (and the control software that operates it) has preset parameters (hereinafter "presets") that can limit the flexibility of the fluid dispense system. The fluid dispense head has a preset firing frequency and a preset speed at which the fluid dispense head can move consistent with the presets. As used herein "the preset minimum pitch" is the distance between two immediately adjacent droplets dispensed at the preset firing frequency when the substrate and fluid dispense ports are moving relative to each other at the preset speed, which in the embodiment as illustrated in FIG. 3 is in the X-direction. The software control has difficulty with non-integer multiples of the preset minimum pitch. Accordingly, only a limited number of fluid droplet patterns that can be produced based on locations on a corresponding X-Y grid. Thus, the software control simply determines the closest integer of preset minimum pitch. For example, a fluid dispense system may have a preset minimum pitch in the X-direction of 35 microns. For an integer-based fluid droplet pattern, allowable integer values include 35 microns, 70 microns, 105 microns, etc. for the fluid droplet pitch in the X-direction. Consequently, the fluid dispense system forms a less-than ideal droplet pattern.

The inventors have discovered a way to take the previously described fluid droplet pattern, based on presets of the apparatus, and render the fluid dispense pattern into an adjusted fluid droplet pattern by adjusting a translation speed (X-direction) of the substrate. In an embodiment, the software control can determine a best integer-based droplet pattern, and then a stage can be set to a translational speed, in combination with the firing frequency of the fluid dispense system, to achieve the adjusted droplet pattern that is closer to an ideal droplet pattern as compared to the best integer-based droplet pattern (before adjustment of the translational speed is made).

Figure 4:
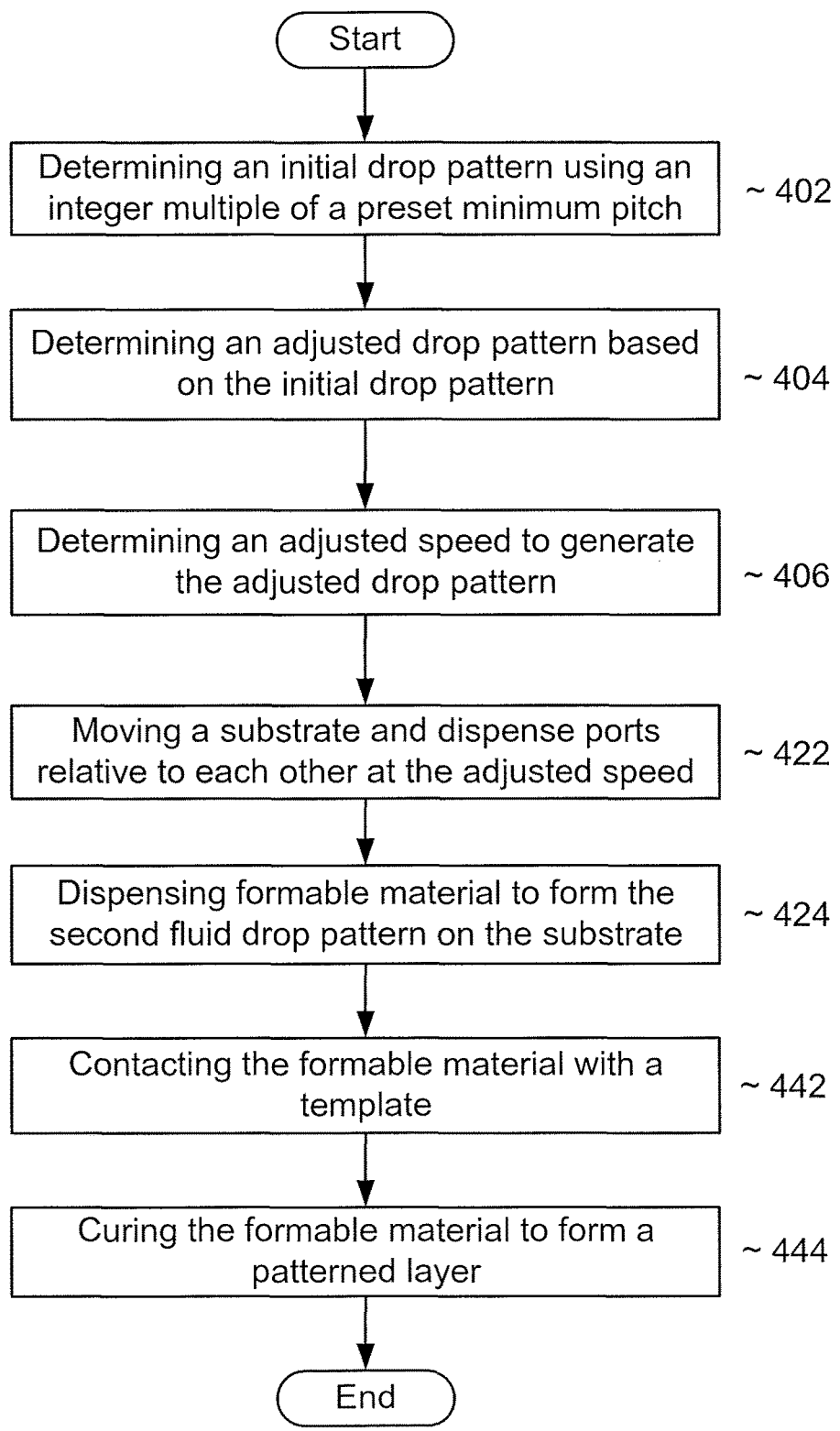
FIG. 4 includes a flow chart of an exemplary method of forming an article, including generating a fluid droplet pattern.

In accordance with an embodiment described herein, FIG. 4 includes a flow chart for a method that can be used forming a fluid droplet pattern for an imprint lithography process. The method can be performed by an imprint lithography apparatus including a fluid dispense system, a stage, and a logic element. In an embodiment, a fluid dispense system having fluid dispense ports defining a line. The fluid dispense system can further be configured to dispense fluid droplets of a formable material at a preset frequency to achieve spaced-apart droplets on a substrate at a preset minimum pitch. The stage, the fluid dispense head, or both can be adapted to move a relative to each other in a direction generally transverse to the line. The logic element can include hardware, firmware, software, or any combination thereof to perform many of the operations described herein. In a particular embodiment, the logic element can be the processor 54. A substrate can be placed on the stage, and in an embodiment, the substrate can be a semiconductor wafer.

At block 402, the method can include determining an initial fluid droplet pattern using an integer multiple of the preset minimum pitch. The initial fluid droplet pattern can be based at least in part on a pattern of an imprint lithography template. The initial fluid droplet pattern is representative of fluid droplets at the preset minimum pitch or an integer multiple thereof as the substrate and the fluid dispense ports are moved relative to each other along a translational direction. Thus, the initial fluid droplet pattern has an integer-based preset minimum pitch.

At block 404, the method can further include determining an adjusted fluid droplet pattern based on the initial fluid droplet pattern. The adjusted fluid droplet pattern is representative of fluid droplets spaced apart at a non-integer multiple of the preset minimum pitch.

At block 406, the method can include determining an adjusted speed used in generating the adjusted fluid droplet pattern. As compared to the preset speed for the initial fluid droplet pattern, the adjusted speed for the adjusted fluid droplet pattern allows for a more ideal fluid droplet pattern that can result in less non-fill defects, lower RLT variation, or both. The logic element can include circuits, a program, or other logic to determine the initial fluid droplet pattern, the adjusted fluid droplet pattern, and the adjusted speed.

As an example, a pitch of 60 microns may work best for a particular patterned layer to be achieved; however, 60 microns is 1.7 times 35 microns. Clearly, 1.7 is not an integer multiple of the preset minimum pitch of 35 microns. Accordingly, the speed adjustment can be made without having to reprogram any of the dispense head presets. For example, the speed of the substrate and the fluid dispense ports relative to each other can be adjusted to be 1.7 times the speed used for the preset minimum pitch of 35 microns. The prior example provides a tangible example and is not meant to limit the scope of the present invention. Other non-integer values for the speed can be greater than 1.00, such as 1.01X, 1.5X, 2.1X, 3.7X, less than 1.00 and include 0.97X, 0.86X, 0.71X, 0.57X, 0.43X, 0.29X, 0.14X, 0.03X, or another non-integer value, where X represents the preset speed, and accordingly, the factor by which the preset speed is to be multiplied. The concepts described herein can apply to other preset minimum pitch and corresponding speed values.

After determining the adjusted speed, the apparatus is ready for processing the substrate. The substrate is placed and held onto the stage. At block 422, the method can include moving the substrate and the fluid dispense ports relative to each other at the adjusted speed. The logic element can send information regarding the adjusted speed to the stage or a stage controller. The adjusted speed is the relative speed of the stage (and consequently, the substrate) and the fluid dispense ports to each other. At block 424, the method can further include dispensing formable material through the fluid dispense ports at the preset frequency to form the adjusted fluid droplet pattern on the substrate.

Referring again to FIG. 3, adjacent fluid droplets in the X-direction can now be spaced apart using a non-unit integer multiple of the preset minimum pitch. For example, when the preset minimum pitch is 35 microns, an X-direction pitch corresponding to a center of a first fluid droplet 310*a* to a center of a second fluid droplet 310*b* can be 34 microns (0.97 times the preset minimum pitch), 30 microns (0.86 times the preset minimum pitch), 25 microns (0.71 times the preset minimum pitch), 20 microns (0.57 times the preset minimum pitch), 15 microns (0.43 times the preset minimum pitch), 10 microns (0.29 times the preset minimum pitch), 5 microns (0.14 times the preset minimum pitch), 1 microns (0.03 times the preset minimum pitch), or any value therebetween. Skilled artisans will appreciate that as the X-direction pitch becomes less than 35 nm, the likelihood that the droplets will coalesce increases. In another example, the X-direction pitch corresponding to the distance between the centers of the droplets 310*a* and 310*b* can be 36 microns (1.03 times the preset minimum pitch), 40 microns (1.14 times the preset minimum pitch), 45 microns (1.29 times the preset minimum pitch), 50 microns (1.43 times the preset minimum pitch), 55 microns (1.57 times the preset minimum pitch), 60 microns (1.71 times the preset minimum pitch), 65 microns (1.86 times the preset minimum pitch), 69 microns (1.97 times the preset minimum pitch), or any value therebetween. Such non-integer X-direction pitches can permit enhanced alignment of the fluid droplets with features of the template as compared to traditional lithographic system operations that are limited to apparatus presets. The X-direction pitches may be obtained by multiplying any of the preset speed used to obtain the preset minimum pitch times any one of the multiples above to obtain the adjusted speed in the translating direction.

Figure 5:
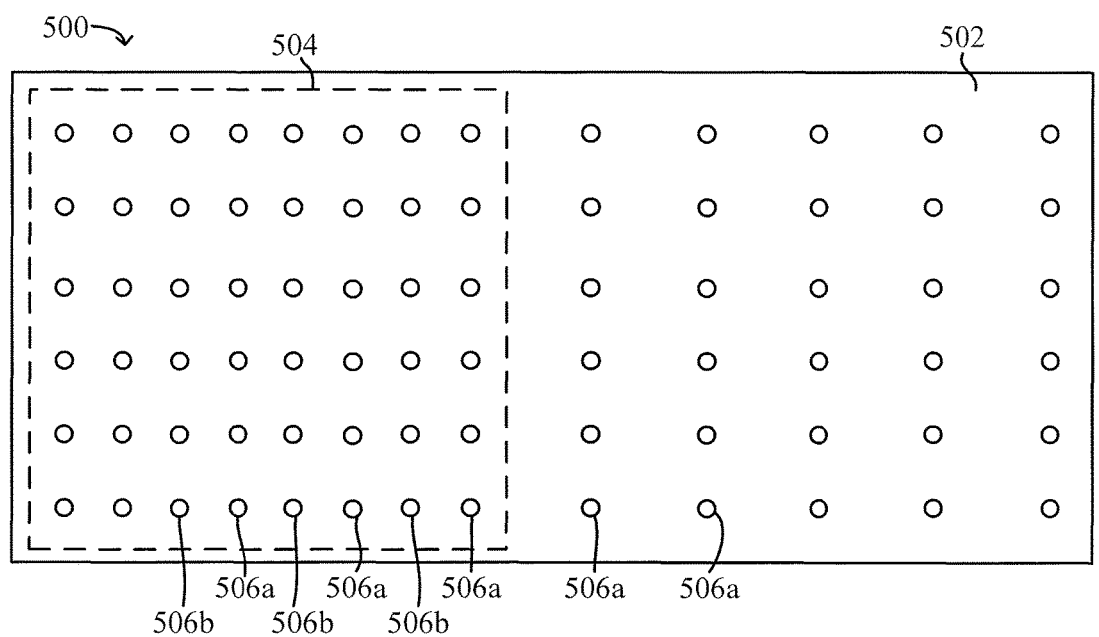
FIG. 5 includes a simplified top view of a surface including a fluid droplet pattern in accordance with an embodiment.

FIG. 5 illustrates a fluid droplet pattern 500 created using traditionally practiced fluid dispensing techniques where the substrate 502 is moved at a standard, non-adjustable X-direction speed. At such speed, using particular fluid dispense systems limited by the apparatus presets, the minimum possible X-direction pitch is 35 µm. In certain instances, one region 504 of the substrate 502 may require a higher density of fluid droplets because of high density of recessions along the patterned surface of the template that will be used to form projections from the formable material. The X-direction pitch within region 504 is different (such as less) than 35 µm. During traditional dispensing, fluid droplets 506*a* are dispensed during a first pass with fluid droplets 506*b* dispensed during a subsequent pass.

Using fluid dispensing techniques as described in accordance with one or more embodiments herein, fluid droplets 506a and 506b can be dispensed in a single pass. Specifically, calculating the appropriate speed to move the substrate 502 along the X-direction allows the X-direction pitch to be at a value other than 35 μm. As a result, the fluid droplet pattern 500, including fluid droplets 506a and 506b, can be deposited in a single pass, reducing the number of passes and thus reducing dispensing time and increasing throughput.

The method can be adapted to address the different spacing is the same pass. As seen in the illustration, the region 504 has a set of fluid droplets at a pitch and areal density as compared to another set of fluid droplet having a different pitch and areal density over the substrate 502, as illustrated near the right-hand side of FIG. 5. Either or both sets of fluid droplets can have a fluid droplet pitch that is a non-integer multiple of the minimum preset pitch. When forming the fluid droplet pattern, both sets of fluid droplets can be dispensed in a single pass. Thus, after dispensing one of the sets of the fluid droplets and before dispensing the other set of the fluid droplets, the translating speed may be changed. In a particular embodiment, the translating speed when forming the set of fluid droplets in the region 504 can be at a non-integer multiple of the preset speed, and when forming the set of fluid droplets outside the region 504, the translating speed may or may not be an integer multiple of the preset speed. In a particular embodiment, all of the fluid droplets in FIG. 5 can be formed at the preset frequency.

In a particular instance, the X-direction pitch can be constant along the X-direction, the Y-direction pitch can be constant along Y-direction, or both. Thus, uniform spacing of droplets can be in either or both the X- and Y-directions. The uniform spacing between adjacent fluid droplets in the X-direction may be performed by moving the surface relative to the fluid dispense portions at the adjusted speed during the entire act of dispensing formable material. That is, keeping the translational speed between the surface and the dispensing ports uniform can permit equal inter-droplet spacing. Alternatively, inter-droplet spacing can be varied, as measured between two different sets of adjacent fluid droplets, by varying the translational speed between the surface and the dispensing ports.

At block 442, the method can include contacting the formable material with the template having a patterned surface. In an embodiment, the patterned surface has projections and recessions, and in another embodiment, the patterned surface can be a blank (a flat surface without any projections or recessions). At block 444, the method includes curing the formable material to form a patterned layer corresponding to the pattern surface of the template. Curing can be performed by exposure to electromagnetic radiation. In an embodiment, the electromagnetic radiation can be ultraviolet radiation. In another embodiment, the formable material can be cured using heat. The patterned layer on the substrate has a complementary pattern as compared to the patterned surface of the template. Projections along the patterned layer correspond to recessions in the patterned surface of the template, and recessions in the patterned layer correspond to projections along the patterned surface of the template. The recessions in the patterned layer are parts of the residual layer.

Patterned layers formed in accordance with embodiments herein have fewer defects as compared to corresponding patterned layers where dispensing formable material occurs without using the adjusted speed. More particularly, it has been found that patterned layers formed in accordance with embodiments herein have fewer defects as compared to corresponding patterned layers having fluid droplets spaced apart by integer-based units (e.g., inter-droplet spacing of 35 μm). As used herein, "defects" refer to areas of the cured patterned layer which are not entirely filled with formable material. Such defects can occur when there is incomplete filling of the template features, caused, for example, by trapped gases or failure to completely fill the template features prior to curing. Such defects can present problems with subsequent formation steps or even reduce operational effectiveness of the finally formed device.

Furthermore, the method can produce a patterned layer with an RLT that is tuned for a particular application. The integer-based initial fluid droplet pattern may provide a single RLT or very little variation of the RTL for a particular template. The adjusted fluid drop pattern can allow a greater variation in RLT for the same template where a significantly thinner or significantly thicker RLT is desired, as compared to the integer-based initial fluid droplet pattern. In general, a thinner RLT provides for more a uniform etch and less critical dimension (CD) variation of the etched features. However, a very thin RLT is more susceptible to separation defects, in particular, features getting torn away from the surface. The integer-based initial fluid droplet pattern may produce the very thin RLT. Thus, a relatively thicker RLT may be desired to avoid potential separation or other defects that may occur with the very thin RLT. Accordingly, the adjusted fluid droplet pattern can be used to tune the RLT for a particular template.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A method of generating a fluid droplet pattern for an imprint lithography process, the method comprising:

determining a first fluid droplet pattern for dispensing a formable material onto a surface of a substrate in an imprint field, wherein the first fluid droplet pattern is based at least in part on a pattern of an imprint lithography template, wherein the first fluid droplet pattern is representative of first fluid droplets spaced apart on the substrate at a preset minimum pitch or an integer multiple thereof when the substrate and fluid dispense system are moved at a preset speed relative to each other while the fluid dispense system dispenses the formable material at a preset frequency;

dispensing the formable material to form the first fluid droplet pattern on the substrate;

determining a second fluid droplet pattern based on the first fluid droplet pattern, wherein the second fluid droplet pattern is representative of second fluid droplets spaced apart on the substrate at a non-integer multiple of the preset minimum pitch;

determining an adjusted speed between the substrate and fluid dispense ports relative to each other to generate the second fluid droplet pattern;

moving the substrate and the fluid dispense ports relative to each other at the adjusted speed; and dispensing the formable material as the second fluid droplets through the fluid dispense ports at the preset frequency to form the second fluid droplet pattern on the substrate, wherein the first fluid droplet pattern and the second fluid droplet pattern are deposited in a single pass.

2. The method of claim 1, further comprising forming a patterned layer on the substrate with the imprint lithography template and the second fluid droplet pattern.

3. The method of claim 1, further comprising forming a patterned layer on the substrate with the imprint lithography template, wherein the patterned layer has a residual layer thickness (RLT) different than an RLT of an other patterned layer formed on the substrate using the imprint lithography template and the first fluid droplet pattern.

4. The method of claim 3, wherein, when expressed as a percentage, a variation of the RLT of the patterned layer is less than a variation of the RLT of the other layer.

5. The method of claim 1, wherein the second fluid droplet pattern includes a first set of fluid droplets having a first fluid droplet pitch and a second set of fluid droplets having a second droplet pitch different from the first fluid droplet pitch, wherein the first fluid droplet pitch or the second fluid droplet pitch is a non-integer multiple of the minimum preset pitch.

6. The method of claim 5, wherein:
the adjusted speed includes a first speed; and
moving the substrate and the fluid dispense ports relative to each other and dispensing the formable material comprises moving the substrate and the fluid dispense ports relative to each other at the first speed and dispensing the formable material through the fluid dispense ports at the preset frequency to form the first set of fluid droplets on the substrate.

7. The method of claim 6, wherein:
the adjusted speed further includes a second speed; and
moving the substrate and the fluid dispense ports relative to each other and dispensing the formable material comprises moving the substrate and the fluid dispense ports relative to each other at a second speed and dispensing the formable material through the fluid dispense ports at the preset frequency to form the second set of fluid droplets on the substrate.

8. The method of claim 1, wherein moving the substrate and fluid dispense ports relative to each other is performed at the adjusted speed during an entire duration of dispensing formable material.

9. The method of claim 1, wherein the adjusted speed is less than the preset speed.

10. The method of claim 1, wherein the adjusted speed is greater than the preset speed.

11. The method of claim 1, wherein each of the first and second fluid droplet patterns is in a rectangular, grid shape.

12. The method of claim 1, wherein each of the first and second fluid droplet patterns is in a diamond shape.

13. A method of manufacturing an article, the method comprising:

determining a first fluid droplet pattern for dispensing a formable material onto a surface of a substrate in an imprint field, wherein the first fluid droplet pattern is based at least in part on a pattern of an imprint lithography template, wherein the first fluid droplet pattern is representative of first fluid droplets spaced apart on the substrate at a preset minimum pitch or an integer multiple thereof when the substrate and fluid dispense system are moved at a preset speed relative to each other while the fluid dispense system dispenses the formable material at a preset frequency;

dispensing the formable material to form the first fluid droplet pattern on the substrate;

determining a second fluid droplet pattern based on the first fluid droplet pattern, wherein the second fluid droplet pattern is representative of second fluid droplets spaced apart on the substrate at a non-integer multiple of the preset minimum pitch;

determining an adjusted speed between the substrate and the fluid dispense ports relative to each other to generate the second fluid droplet pattern;

moving the substrate and the fluid dispense ports relative to each other at the adjusted speed;

dispensing the formable material as the second fluid droplets through the fluid dispense ports at the preset frequency to form the second fluid droplet pattern on the substrate, wherein the first fluid droplet pattern and the second fluid droplet pattern are deposited in a single pass;

contacting the formable material with the template having a patterned surface; and curing the formable material to form a patterned layer corresponding to the patterned surface of the template.

14. The method of claim 13, wherein the article includes an electronic device, and the substrate includes a semiconductor wafer.

15. A method of generating a fluid droplet pattern for an imprint lithography process, the method comprising:

determining a first fluid droplet pattern for dispensing a formable material onto a surface of a substrate in an imprint field, wherein the first fluid droplet pattern is representative of first fluid droplets spaced apart on the substrate at a first pitch or an integer multiple thereof when the substrate and fluid dispense system are moved at a first speed relative to each other while the fluid dispense system dispenses the formable material at a first frequency;

determining a second fluid droplet pattern for dispensing a formable material onto the surface of the substrate in the same imprint field, wherein the second fluid droplet pattern is representative of second fluid droplets spaced apart on the substrate at a non-integer multiple of the first pitch; dispensing the formable material at the first frequency to form the first fluid droplet pattern on the substrate at the first pitch while the substrate and fluid dispense system are moved at the first speed relative to each other; and dispensing the formable material at the first frequency to form the second fluid droplet pattern on the substrate at a second pitch while the substrate and fluid dispense system are moved at a second speed relative to each other, wherein the second speed is different than the first speed, and wherein the first fluid droplet pattern and the second fluid droplet pattern are deposited in a single pass.

16. The method of claim 15, wherein the first pitch of the first fluid droplet pattern and the second pitch of the second droplet pattern are dispensed in a single pass.

* * * * *